United States Patent
Tran et al.

(10) Patent No.: US 7,304,507 B1
(45) Date of Patent: Dec. 4, 2007

(54) MODULAR BUFFERING CIRCUITRY FOR MULTI-CHANNEL TRANSCEIVER CLOCK AND OTHER SIGNALS

(75) Inventors: Thungoc Tran, San Jose, CA (US); Sergey Yuryevich Shumarayev, San Leandro, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 92 days.

(21) Appl. No.: 11/288,496

(22) Filed: Nov. 28, 2005

Related U.S. Application Data

(60) Provisional application No. 60/700,840, filed on Jul. 19, 2005.

(51) Int. Cl.
*H03K 19/00* (2006.01)
(52) U.S. Cl. .......................................... 326/93; 326/41
(58) Field of Classification Search ............ 326/37–41, 326/93–98
See application file for complete search history.

(56) References Cited

U.S. PATENT DOCUMENTS

| | | | |
|---|---|---|---|
| 6,690,195 B1 | 2/2004 | Ngai et al. | |
| 7,075,365 B1 * | 7/2006 | Starr et al. | 327/565 |

\* cited by examiner

*Primary Examiner*—Don Le
(74) *Attorney, Agent, or Firm*—Ropes & Gray LLP; Robert R. Jackson

(57) ABSTRACT

Circuitry for distributing signals such as reference clock signals among blocks of transceiver circuitry on an integrated circuit such as a field programmable gate array ("FPGA") employs bidirectional buffers rather than unidirectional buffers. This allows all buffers to have the same construction regardless of physical location, which facilitates construction of the circuitry using identical or substantially identical modules. The same approach may be used for distributing other types of signals among the transceiver blocks. For example, this approach may be used for distributing calibration control signals.

14 Claims, 7 Drawing Sheets

MODULAR BUFFERING CIRCUITRY FOR MULTI-CHANNEL TRANSCEIVER CLOCK AND OTHER SIGNALS

This application claims the benefit of U.S. provisional patent application No. 60/700,840, filed Jul. 19, 2005, which is hereby incorporated by reference herein in its entirety.

BACKGROUND OF THE INVENTION

This invention relates to integrated circuit devices such as field-programmable gate arrays ("FPGAs"), and more particularly to circuitry on FPGAs that can be used to transmit and/or receive data signals in multiple channels.

An integrated circuit such as an FPGA may be provided with multiple channels of circuitry for transmitting and/or receiving data. These channels may be grouped into several groups of channels. Each group may receive a reference clock signal. For greater flexibility of use of the circuitry, it may be desirable to be able to use the reference clock signal received by any of the groups in that group and/or in any others of the groups. Any such distribution or sharing of clock signals among the groups is preferably done as efficiently as possible. This is aided by performing the clock signal distribution—including any necessary buffering of the signals—within the circuitry of the groups. It is also desirable for the circuitry of all of the groups to be the same or substantially the same, e.g., because this facilitates design and verification of the circuitry.

Similar considerations may apply to other signals that may need to be communicated to the groups. Examples of such other signals are calibration control signals, which may be used for such purposes as controlling the effective values of circuit elements that provide terminations of data signal connections to circuitry external to the integrated circuit device.

Improved clock and other signal distribution circuitry that will help satisfy criteria such as those identified above is needed.

SUMMARY OF THE INVENTION

To help make it possible to use a plurality of identical or substantially identical circuit modules to provide multi-channel communication (e.g., transceiver) circuitry on an integrated circuit (e.g., an FPGA), bidirectional (rather than unidirectional) buffers are used where buffers are required in the circuitry that distributes signals among the modules. Signals for which this may be done include reference clock signals and/or calibration control signals. By using bidirectional buffers, all buffers can be physically the same. Each bidirectional buffer is controlled (e.g., by programmable control signals) to operate in only the one direction required for a buffer at the location of that bidirectional buffer.

Further features of the invention, its nature and various advantages, will be more apparent from the accompanying drawings and the following detailed description.

DETAILED DESCRIPTION

Figure 1:
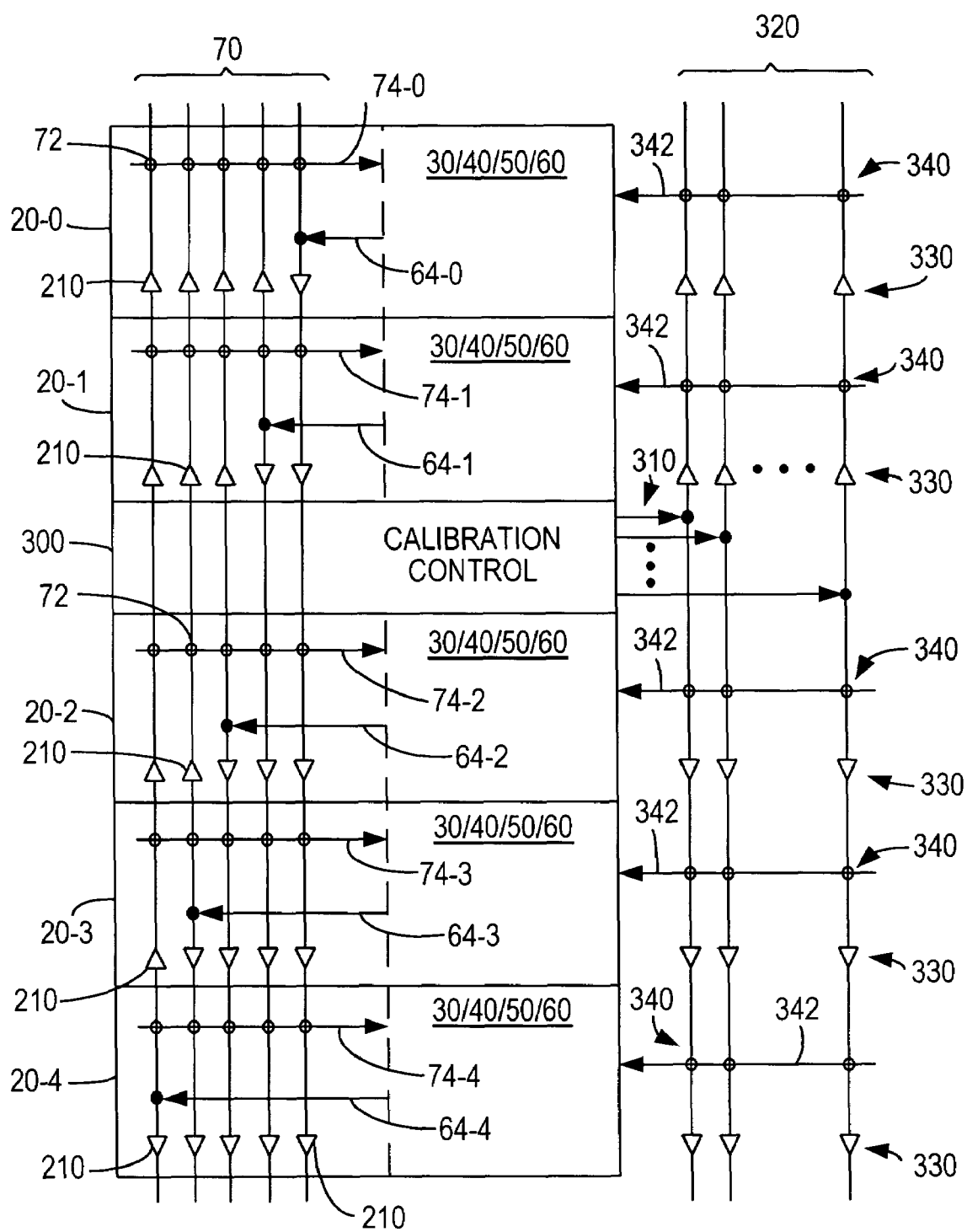
FIG. 1 is a simplified schematic block diagram of illustrative circuitry of a type that this invention can be used to improve upon.

FIG. 1 shows an illustrative embodiment of circuitry of a type that this invention can be used to improve upon. This circuitry can be of the general type shown, for example, in Hoang et al. U.S. patent application Ser. No. 11/270,718, filed Nov. 8, 2005 (based on U.S. provisional patent application No. 60/700,858, filed Jul. 19, 2005). Both of these references are hereby incorporated by reference herein in their entireties. Because of similarities to the circuitry described in the referenced material, the description of FIG. 1 herein can be somewhat abbreviated.

FIG. 1 shows several "quads" (or blocks or groups) of what may be referred to as high-speed serial interface ("HSSI") circuitry. In particular, FIG. 1 shows quads 20-0 through 20-4. Each quad 20 includes several (e.g., four) channels of HSSI circuitry 30, and a unit of clock management ("CMU") circuitry 40 (see FIG. 2, which shows representative quad 20-0 in somewhat more detail, and which is somewhat similar to FIG. 2 in the above-referenced non-provisional application).

The CMU 40 in each quad receives a reference clock signal 60. CMU 40 buffers this signal (element 62) and applies it via lead 64 to a respective one of reference clock signal distribution conductors 70. Each conductor 70 conveys the signal it receives adjacent all of quads 20. Each quad can take in the signal on any of conductors 70 for use as a reference clock for phase-locked loop ("PLL") circuitry 50 in the CMU 40 of that quad. Connections 72 (which may be programmable) and conductors 74 allow this selective routing of reference clock signals into the CMUs 40 of the various quads 20.

Because of the physical size of the quads, and possibly also for other reasons, the signal on each lead 70 is buffered adjacent each quad. Buffers 210 are provided for this purpose. (Such buffering may also be referred to by some as re-buffering. But the term buffering will generally be used herein as a generic for buffering and re-buffering.) In circuitry of the type shown in FIGS. 1 and 2, each buffer 210 must be arranged to drive the signal on the associated conductor 70 away from the point where that signal is applied to that conductor. Thus FIG. 1 shows all of the buffers 210 on the right-most conductor 70 driving down because the signal on that conductor comes from top-most quad 20-0. With regard to the buffers 210 on the next-to-right-most conductor 70, the top-most buffer 210 drives up and all the other buffers 210 drive down because the signal on that conductor comes from the second-to-top-most quad 20-1. It will be apparent from these examples and further consideration of FIG. 1 that the arrangement of buffers 210 on each conductor 70 is unique. Similarly, the arrangement of buffers 210 associated with each of quads 20 is unique. For example, for quad 20-0 the four left-hand buffers 210 drive up and the right-most buffer 210 drives down, but for quad 20-1 the three left-hand buffers 210 drive up and the two right-hand buffers 210 drive down.

It is desirable for quads 20 to be as modular as possible. "Modular" quads are quads that are identical or nearly identical to one another. This facilitates such things as design, verification, and even use of the circuitry (e.g., because timing is more consistent from quad to quad if they are the same). Making the associated segment of reference clock distribution circuitry 70 modular in the same way that the rest of a quad 20 is modular is desirable for similar reasons. However, the requirement in FIG. 1 for a unique arrangement of drivers 210 associated with each quad is inconsistent with this objective of modularity.

A similar problem exists with the distribution of calibration control signals 310 from calibration control circuitry 300. These are signals that may be used to control calibration of various circuit elements in the various channels 30 of the quads. For example, these signals may be used to control the "values" of various circuit elements that are part of the circuitry used to terminate a data signal or connection that is external to the integrated circuit device (e.g., for improved impedance matching or the like). FIG. 1 shows calibration control circuitry 300 fairly centrally located among the five quads 20-0 through 20-4. The calibration control signals on distribution conductors 320 need buffering adjacent to each successive quad 20 that they pass. This means that the buffers 330 provided for this purpose must drive up adjacent to quads 20-0 and 20-1, but the buffers 330 adjacent to quads 20-2 through 20-4 must drive down. This difference in the arrangement of buffers 330 for different quads is again contrary to the objective of providing modular quad or quad-related circuitry.

Figure 2:
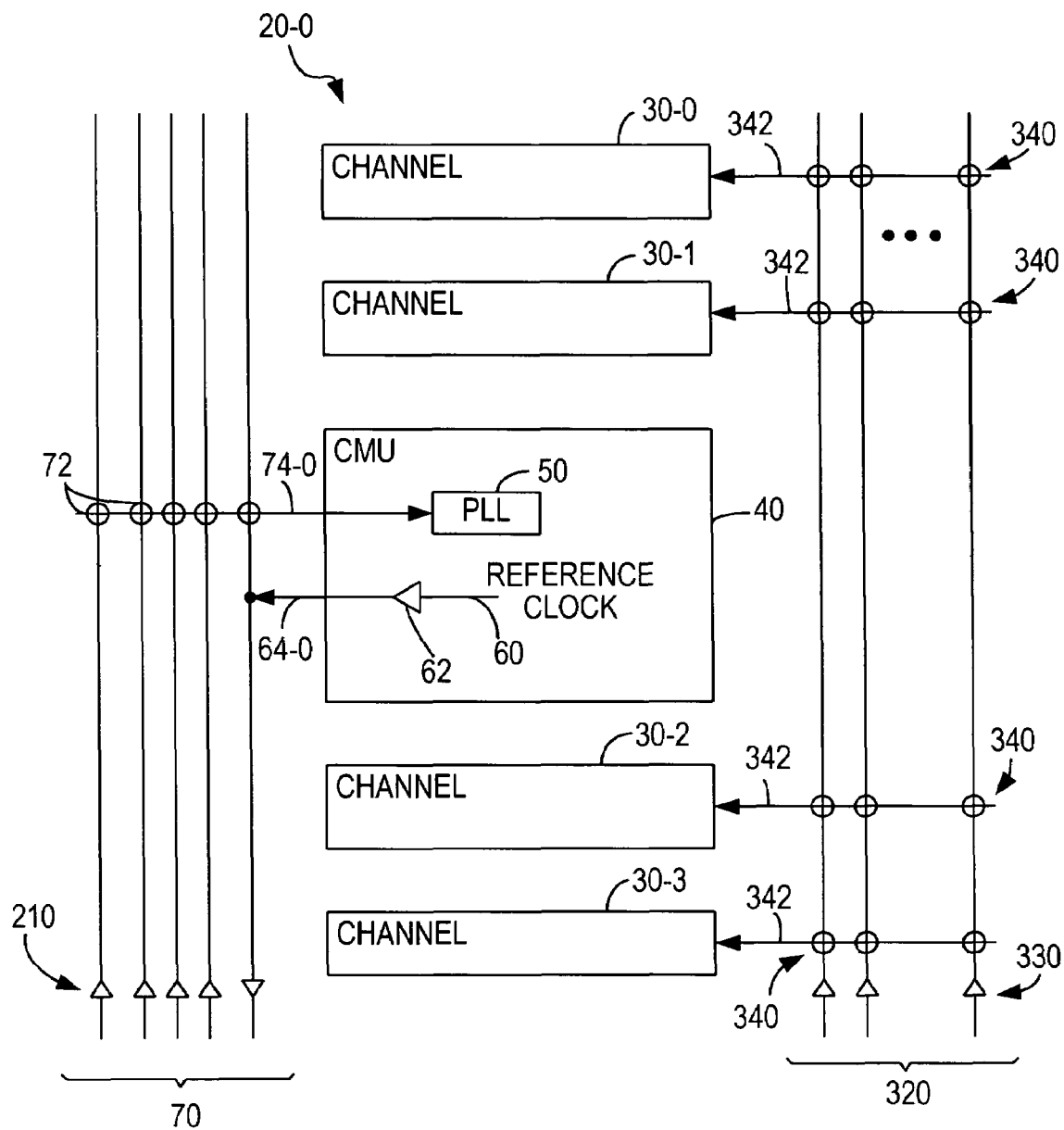
FIG. 2 is a simplified schematic block diagram showing an illustrative embodiment of a representative portion of FIG. 1 in more detail.
Figure 3:
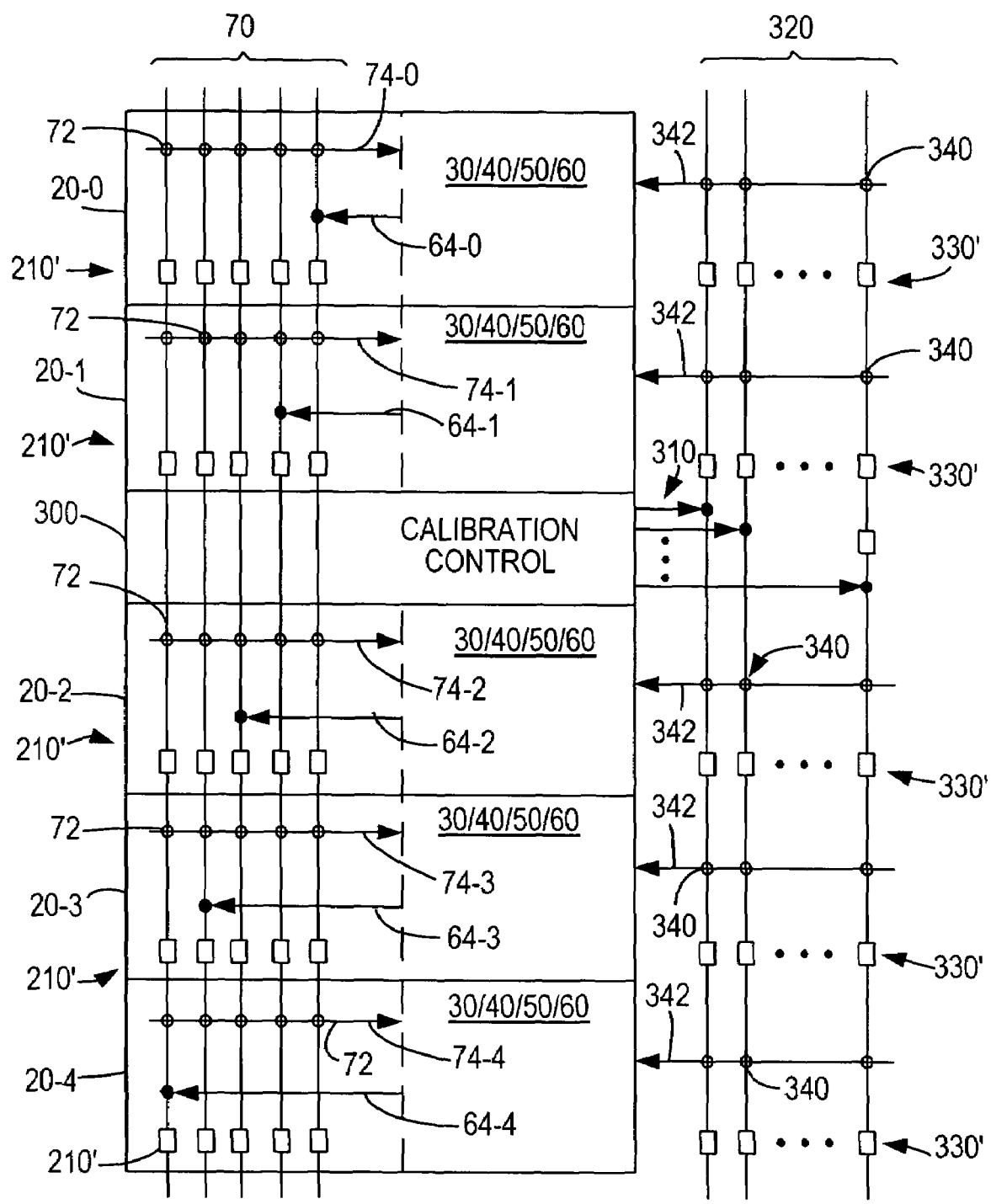
FIG. 3 is a simplified schematic block diagram of an illustrative embodiment of circuitry constructed in accordance with the invention.
Figure 4:
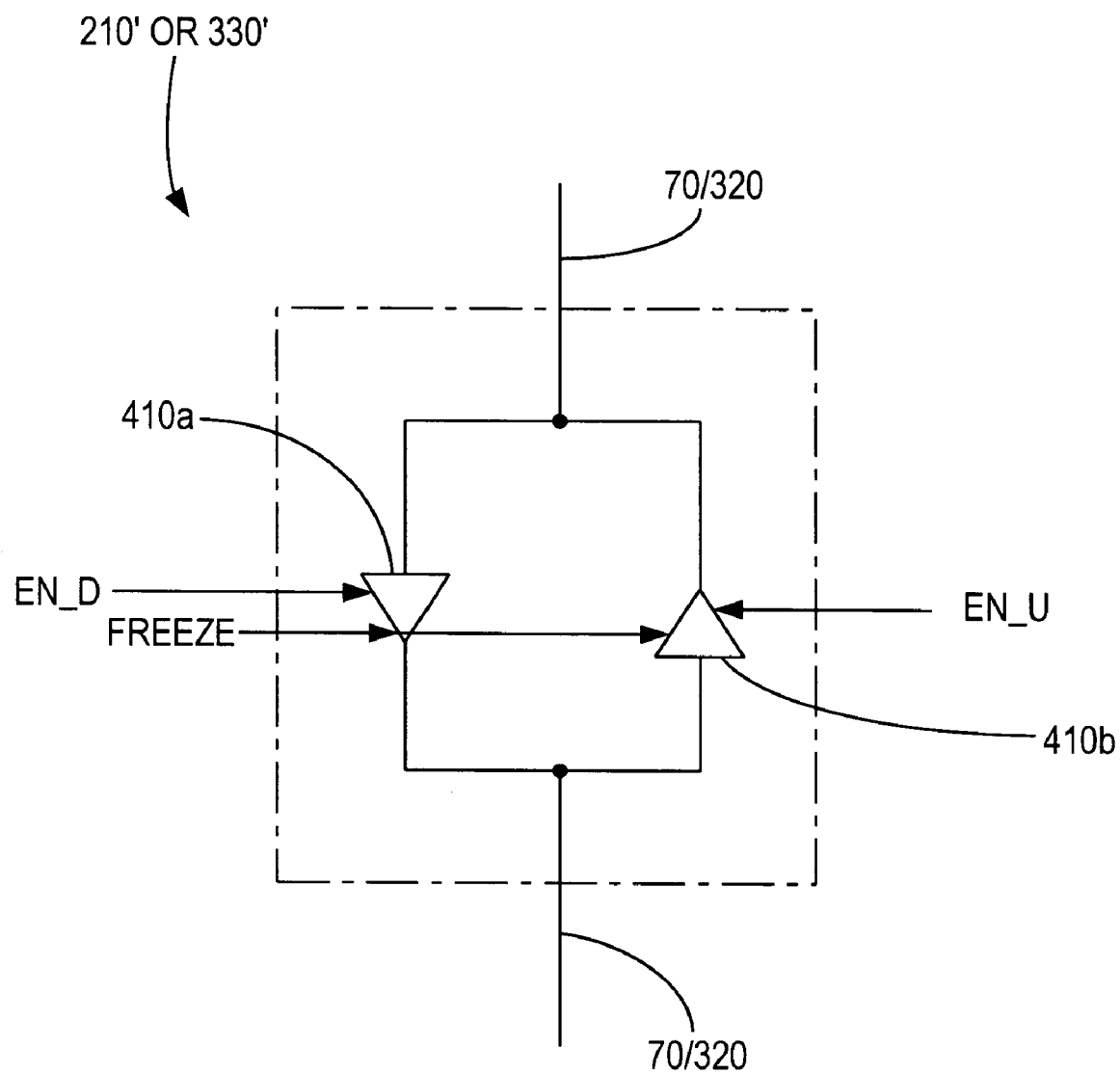
FIG. 4 is a simplified schematic block diagram of an illustrative embodiment of a representative portion of FIG. 3 in more detail.

FIG. 3 shows illustrative modification of circuitry of the type shown in FIGS. 1 and 2 in accordance with this invention. In the illustrative embodiment shown in FIG. 3 each of unidirectional buffers 210 and 330 from FIGS. 1 and 2 is replaced by bidirectional buffer circuitry 210' or 330', respectively. An illustrative embodiment of such bidirectional circuitry is shown in FIG. 4. As shown in that FIG., bidirectional buffer circuitry 210'/330' includes buffer 410*a*, which (if enabled) drives a signal from the upper conductor segment 70/320 down onto the lower conductor segment 70/320. Bidirectional buffer circuitry 210'/330' also includes buffer 410*b*, which (if enabled) drives a signal up from the lower conductor segment 70/320 to the upper conductor segment 70/320. Buffer 410*a* is selectively enabled by the EN_D signal. Buffer 410*b* is selectively enabled by the EN_U signal.

Figure 5:
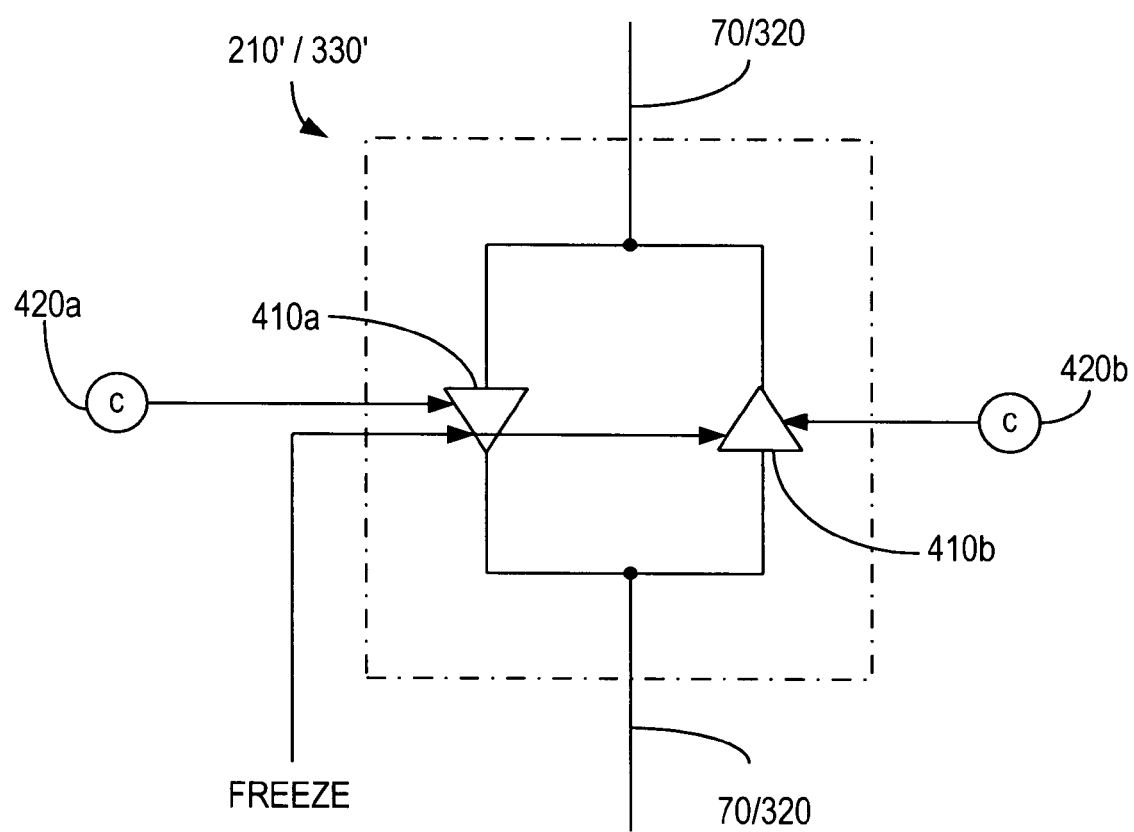
FIG. 5 is similar to FIG. 4 with more possible elements shown.

EN_D and EN_U may come from any suitable sources, such as programmable configuration random access memory ("CRAM") bits or cells on the integrated circuit that includes the FIG. 3/4 circuitry. FIG. 5 shows this type of arrangement, wherein each of control circuit elements 420*a* and 420*b* can be a programmable CRAM cell. By appropriately programming control circuit elements 420*a* and 420*b*, either buffer 410*a* or buffer 410*b* can be enabled. If buffer 410*a* is enabled, circuitry 210'/330' operates as a downward-driving buffer (e.g., as is needed in the upper right-hand instance of buffers 210' in FIG. 3 or all instances of buffers 330' below leads 310 in that FIG.). On the other hand, if buffer 410*b* is enabled, circuitry 210'/330' operates as an upward-driving buffer (e.g., as is needed in the upper left-hand instance of buffers 210' in FIG. 3 or all instances of buffers 330' above leads 310 in that FIG.).

From the foregoing, it will be seen that this invention permits the same circuitry (e.g., as in FIG. 4 or FIG. 5) to be used for all instances of buffers 210' in FIG. 3, and also for all instances of buffers 330' in that FIG. This helps modularize the circuitry of the various quads (i.e., it facilitates making the quads and their associated inter-quad signal distribution circuitry 70/320 the same from quad to quad). It is not necessary to make the circuitry irregular (as in FIGS. 1 and 2) by having some buffers 210 and/or 330 that are different from one another (i.e., some that drive up and some that drive down). All buffers 210' can be physically the same. Whether a particular buffer 210' drives up or down can be determined by programmable control. The same is true for buffers 330'. All can be physically the same, with programmable control determining whether a particular buffer 330' drives up or down.

Circuitry 70 can be further modularized by also employing what is shown in the above-referenced Hoang et al. material. That material shows how connection of each conductor 64-0 through 64-4 into distribution circuitry 70 can be made the same for each quad 20.

Two other aspects of what has been shown should be mentioned. First, if a buffer 210' or 330' is not needed in a particular use of the integrated circuit device, that buffer can be completely turned off by turning off both of its buffers 410*a* and 410*b* (i.e., by making both of EN_D and EN_U buffer-disabling). Second, the FREEZE signal can be used to hold each buffer to a known state during power-up.

Figure 6:
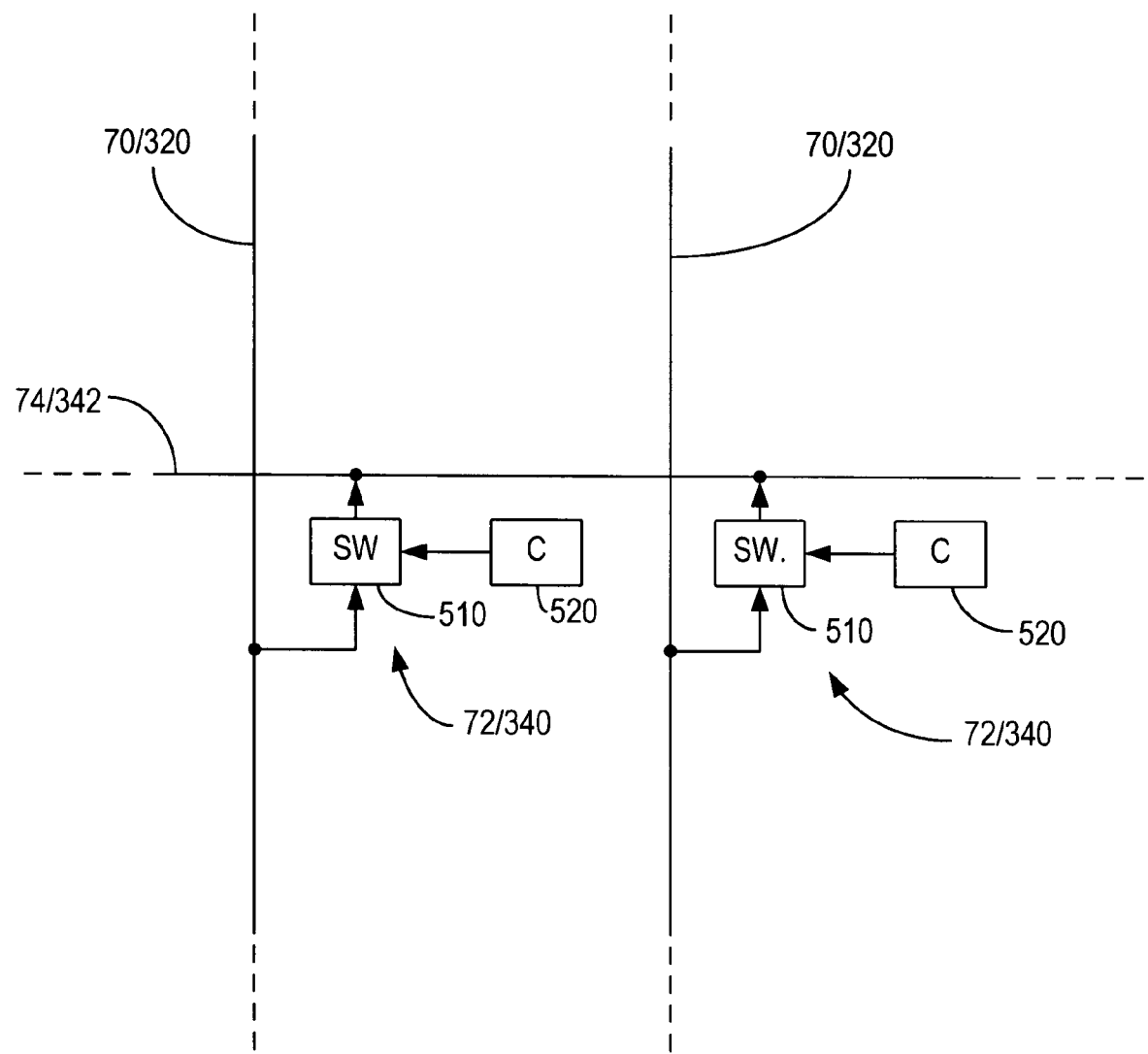
FIG. 6 is a simplified schematic block diagram of a representative portion of any of FIGS. 1-3 in more detail.

FIG. 6 shows an illustrative embodiment of circuitry of the type shown at 72 and/or 340 in several earlier FIGS. Any of distribution signal conductors 70/320 can be connected to representative conductor 74/342 by selectively closing the switch 510 (e.g., a transistor) between those two conductors. Whether a switch 510 is open or closed is controlled by the state of the associated control circuit element 520 (e.g., a programmable CRAM cell of the type described above in connection with FIG. 5).

Figure 7:
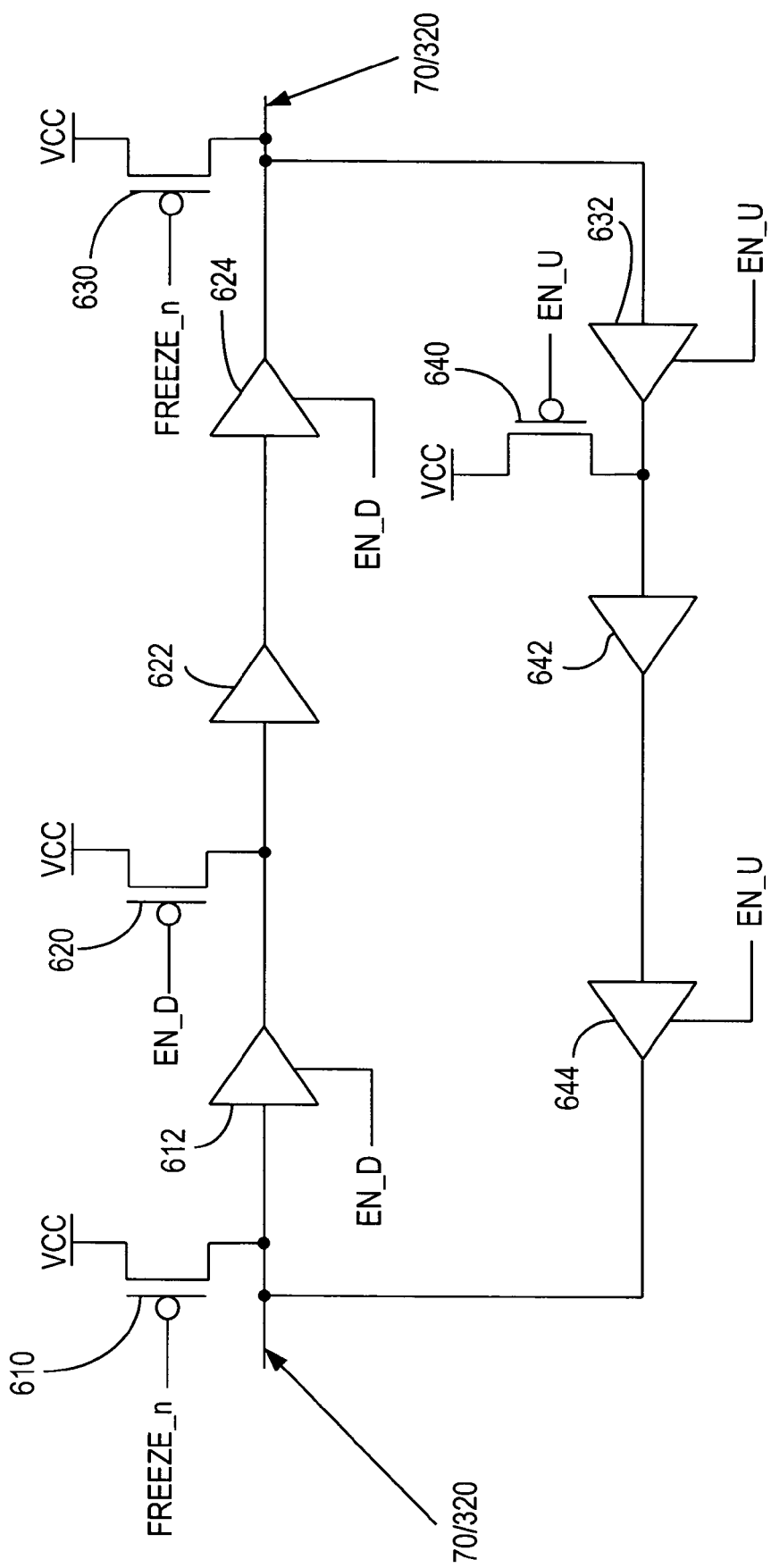
FIG. 7 is a simplified schematic block diagram of an illustrative embodiment of circuitry of the type shown in FIG. 4 or FIG. 5 in more detail.

An illustrative embodiment of circuitry of the type shown in FIG. 4 or FIG. 5 is shown in more detail in FIG. 7. In FIG. 7 elements 610, 620, 630, and 640 are PMOS transistors; elements 612, 624, 632, and 644 are tri-state buffers; and elements 622 and 642 are buffers. VCC is the power supply voltage source. An inverse FREEZE signal is applied to the gates of transistors 610 and 630. The EN_D signal is applied to the buffer-enabling input terminals of tristate buffers 612 and 624, and to the gate of transistor 620. The EN_U signal is applied to the buffer-enabling input terminals of tristate buffers 632 and 644, and to the gate of transistor 640. The PMOS connections 610 and 630 to VCC are selective (i.e, FREEZE-signal-controlled) pull-ups for the associated nodes. The PMOS connections 620 and 640 to VCC are weak pull-ups for the associated nodes.

To briefly recapitulate some of the above in somewhat different terms, multi-channel communication circuitry on an integrated circuit may include a plurality of blocks 20 of communication circuitry. Each block 20 may include a source of a signal 60/62/64 for distribution to the plurality of blocks 20. A plurality of conductors 70 may extend along the plurality of blocks 20. Each conductor 70 conveys a respective one of the signals to the plurality of blocks 20. Each of conductors 70 may include bidirectional buffers 210' between its endpoints (e.g., top and bottom of FIG. 3). The circuitry may further include circuitry for controlling each of bidirectional buffer circuitries 210' to drive in only one of its two possible drive directions (up or down in FIG. 3). The circuitry for controlling (e.g., 420) may be programmable. Each of conductors 70 may include one of bidirectional buffer circuitries 210' adjacent each of blocks 20. The circuitry may also include a source 300 of a calibration control signal 310, and a calibration control signal distribution conductor 320 extending along the plurality of blocks 20. The calibration control signal distribution conductor 320 may include bidirectional buffers 330' between its endpoints. The circuitry may still further include circuitry for controlling the bidirectional buffer circuitry 330' in the calibration control signal distribution conductor 320 to drive in only one of its two possible drive directions. This last-mentioned circuitry for controlling (e.g., 420) may be programmable. The calibration control signal distribution conductor 320 may include bidirectional buffer circuitry 330' adjacent each of blocks 20. The source 300 of calibration control signal 310 may be disposed between two of blocks 20.

Another way to briefly recapitulate some of the above is as follows. Multi-channel transceiver circuitry on an FPGA may include a plurality of blocks 20 of transceiver circuitry. Each block 20 may include a source 60/62/64 of a reference clock signal, and a segment of distribution circuitry 70 for distributing the reference clock signals to the plurality of blocks 20. Each of these segments may include bidirectional buffer circuitry 210' for each of the reference clock signals. The circuitry may further include a source 300 of a calibration control signal 310 disposed between two of blocks 20. Each of blocks 20 may further include a portion of calibration control signal distribution circuitry 320 for distributing the calibration control signal to the plurality of blocks 20. Each of the last-mentioned portions may include bidirectional buffer circuitry 330'.

Still another recapitulation of some of the above is as follows. High-speed serial interface circuitry on an integrated circuit may include a plurality of blocks 20 of high-speed serial interface circuitry. Each block 20 may include a source 60/62/64 of a reference clock signal, and a segment of distribution circuitry 70 for distributing the reference clock signals to the plurality of blocks 20. Each segment may include bidirectional buffer circuitry 210' for each of the reference clock signals.

It will be understood that the foregoing is only illustrative of the principles of the invention, and that various modifications can be made by those skilled in the art. For example, the numbers of various types of components shown herein (e.g., the number of channels in a quad, the number of quads on the device, etc.) is only illustrative, and larger or smaller numbers can be used instead if desired. A quad can include more than one CMU 40, and distribution circuitry 70 can be expanded to handle any number of signals. The particular circuit geometries shown herein (e.g., quads in a vertical column) are only illustrative, and other geometries can be used instead if desired (e.g., quads in a horizontal row). Although each channel 30 is preferably a transceiver (including both data signal transmitter components and data signal receiver components), this may not be necessary in all embodiments. For example, some embodiments may employ channels that are only transmitters or only receivers. Not all capabilities of the device are necessarily used in all applications of the device. For example, some channels 30 may not be used, or some quads 20 may not be used, etc.

What is claimed is:

1. Multi-channel communication circuitry on an integrated circuit comprising:
    a plurality of blocks of communication circuitry, each of which includes a source of a first signal for distribution to the plurality of blocks;
    a plurality of first conductors extending along the plurality of blocks, each of which conveys a respective one of the first signals to the plurality of blocks, each of the first conductors including first bidirectional buffer circuitry between its endpoints; and
    a source of a calibration control signal; and
    a calibration control signal distribution conductor extending along the plurality of blocks, the calibration control signal distribution conductor including second bidirectional buffer circuitry between its endpoints.

2. The circuitry defined in claim 1 further comprising:
    circuitry for controlling each of the first bidirectional buffer circuitries to drive in only one of its two possible drive directions.

3. The circuitry defined in claim 2 wherein the circuitry for controlling is programmable.

4. The circuitry defined in claim 1 wherein each of the first conductors includes one of the bidirectional buffer circuitries adjacent each of the blocks.

5. The circuitry defined in claim 1 wherein each of the first signals is a reference clock signal.

6. The circuitry defined in claim 1 further comprising:
    circuitry for controlling the second bidirectional buffer circuitry included in the calibration control signal distribution conductor to drive in only one of its two possible drive directions.

7. The circuitry defined in claim 6 wherein the circuitry for controlling is programmable.

8. The circuitry defined in claim 1 wherein the calibration control signal distribution conductor includes second bidirectional buffer circuitry adjacent each of the blocks.

9. The circuitry defined in claim 8 wherein the source of the calibration control signal is disposed between two of the blocks.

10. Multi-channel transceiver circuitry on an FPGA comprising:
    a plurality of blocks of transceiver circuitry, each of which includes a source of a reference clock signal and a segment of distribution circuitry for distributing the reference clock signals to the plurality of blocks, each of the segments including first bidirectional buffer circuitry for each of the reference clock signals; and
    a source of a calibration control signal disposed between two of the blocks, and wherein each of the blocks further comprises a portion of calibration control signal distribution circuitry for distributing the calibration control signal to the plurality of blocks, each of the portions including second bidirectional buffer circuitry.

11. The circuitry defined in claim 10 further comprising:
    circuitry for selectively controlling each of the first bidirectional buffer circuitries to drive in only one of its two possible directions.

12. The circuitry defined in claim 11 wherein the circuitry for controlling is programmable.

13. The circuitry defined in claim 10 further comprising:
    circuitry for controlling each of the second bidirectional buffer circuitries in the calibration control signal distribution circuitry to drive in only one of its two possible drive directions.

14. The circuitry defined in claim 13 wherein the circuitry for controlling is programmable.

* * * * *